US008111099B2

(12) United States Patent
Wu et al.

(10) Patent No.: US 8,111,099 B2
(45) Date of Patent: Feb. 7, 2012

(54) MULTI-CHANNEL AUDIO PLAYBACK APPARATUS AND METHOD

(75) Inventors: Li-Te Wu, Taipei (TW); Cheng-Feng Shih, Taoyuan County (TW)

(73) Assignee: Fortemedia, Inc., Sunnyvale, CA (US)

( * ) Notice: Subject to any disclaimer, the term of this patent is extended or adjusted under 35 U.S.C. 154(b) by 549 days.

(21) Appl. No.: 12/343,807

(22) Filed: Dec. 24, 2008

(65) Prior Publication Data

US 2010/0158266 A1 Jun. 24, 2010

(51) Int. Cl.
*H03F 3/38* (2006.01)
*H04R 5/00* (2006.01)

(52) U.S. Cl. ......... 330/10; 330/251; 330/207 A; 381/17; 381/80; 381/94.5; 381/106; 381/417

(58) Field of Classification Search .................... 330/10, 330/207 A, 251; 381/17, 80, 94.5, 106, 417
See application file for complete search history.

(56) References Cited

U.S. PATENT DOCUMENTS

| | | | | |
|---|---|---|---|---|
| 7,057,381 | B2 * | 6/2006 | Harriman et al. | 323/285 |
| 7,332,962 | B2 * | 2/2008 | Wu et al. | 330/251 |
| 7,545,207 | B2 * | 6/2009 | Chang et al. | 330/10 |
| 7,816,982 | B2 * | 10/2010 | Wu et al. | 330/10 |

* cited by examiner

*Primary Examiner* — Dao H Nguyen
(74) *Attorney, Agent, or Firm* — Thomas|Kayden

(57) ABSTRACT

A multi-channel audio playback apparatus including a channel interface, a first switching amplifier and a second switching amplifier is provided. The channel interface is used to receive multi-channel digital data and generate first channel digital data and second channel digital data. The first switching amplifier is used to convert the first channel digital data into a first pulse width modulation (PWM) signal according to a first reference signal with a first frequency. The second switching amplifier is used to convert the second channel digital data into a second PWM signal according to a second reference signal with a second frequency. The second frequency is different from the first frequency.

12 Claims, 10 Drawing Sheets

MULTI-CHANNEL AUDIO PLAYBACK APPARATUS AND METHOD

BACKGROUND OF THE INVENTION

1. Field of the Invention

The present invention relates to audio playback apparatuses and methods, and in particular relates to a multi-channel audio playback apparatus and method.

2. Description of the Related Art

Switching amplifiers, also named as class D amplifiers, are used as audio playback power amplifiers and have become more and more popular in portable devices due to their power efficiency. Moreover, switching amplifiers do not require heat sink devices to dissipate heat, thus, taking up less volume when used in portable devices.

FIG. 1 shows a schematic diagram of a conventional multi-channel audio playback apparatus. The multi-channel audio playback apparatus 100 comprises a serial-to-parallel data formatter 102, a switching amplifier 104, and loudspeakers 191 and 192.

The serial-to-parallel data formatter 102 receives multi-channel digital data 120 from a source (not shown) and separates the multi-channel digital data 120 in serial format into first channel digital data 121 and second channel digital data 122 in parallel format. As is well known in the art, the first channel digital data 121 and second channel digital data 122 can be left channel data and right channel data in a stereo audio system. Moreover, the serial-to-parallel data formatter 102 can separate the multi-channel digital data 120 into five channels which are left, right, center, left-back, right-back and subwoofer channels in a Dolby 5.1 system.

Taking a stereo audio system for example, the switching amplifier 104 further comprises a first digital-to-analog converter (DAC) 141, a second DAC 142, a reference signal generator 110, a first comparator 151, a second comparator 152, a first driver 161 and a second driver 162. The first DAC 141 and the second DAC 142 respectively convert the first channel digital data 121 and the second channel digital data 122 into first channel analog data 131 and second channel analog data 132. The reference signal generator 110 generates a reference signal 111 with a specific frequency and outputs the reference signal 111 to the first comparator 151 and the second comparator 152.

FIG. 2A illustrates the relationship between the first channel analog data 131 and the reference signal 111 of FIG. 1. The first comparator 151 receives the first channel analog data 131 from the first DAC 141 and the reference signal 111 from the reference signal generator 110 and compares the first channel analog data 131 with the reference signal 111 in order to generate the first pulse width modulation (PWM) signal 181. FIG. 2B illustrates the first PWM signal of FIG. 1. To explain in detail, when the first channel analog signal 131 is higher than the reference signal 111, the first PWM signal 181 is high (labeled as "1" in FIG. 2B). When the first channel analog signal 131 is lower than the reference signal 111, the first PWM signal 181 is low (labeled as "0" in FIG. 2B). FIG. 2C illustrates the relationship between the second channel analog data 132 and the reference signal 111 of F*ig*. 1 and FIG. 2D illustrates the second PWM signal 182 of FIG. 1. Accordingly, the second comparator 152 compares the second channel analog data 132 with the reference signal 111 in order to generate the second PWM signal 182. Then, the first driver 161 and the second driver 162 respectively use the first PWM signal 181 and the second PWM signal 182 to drive the first loudspeaker 191 and the second loudspeaker 192.

However, while the multi-channel audio playback apparatus 100 is playing sounds through the loudspeaker 191 and 192, severe radio frequency (RF) interference occurs. FIGS. 3A, 3B and 3C respectively shows the frequency spectrum of the first PWM signal 181, the second PWM signal 182 and combinations thereof of FIG. 1. The first PWM signal 181 in the frequency spectrum comprises a first channel audio frequency 312 corresponding to the first channel analog data 131 and a first carrier frequency 314 corresponding to the reference signal 111. Accordingly, the second PWM signal 182 in the frequency spectrum comprises a second channel audio frequency 322 corresponding to the second channel analog data 132 and a second carrier frequency 324 corresponding to the same reference signal 111, wherein the first carrier frequency 314 is the same as the second carrier frequency 324. However, while channel analog data 312 and 322 are being played as sounds from the loudspeakers, the carrier frequencies 314 or 324, in the range of 100 kHz~400 kHz in most cases, contain non-ideal components in the PWM signals. Since most loudspeakers are made of magnetic materials, non-ideal components in the PWM signals radiate easily within the loudspeakers, thus affecting radio signals. In addition, with the same frequency (as shown in FIG. 3C), radio signals are further deteriorated when the amplitude of the second carrier frequency 324 is superposed onto the amplitude of the first carrier frequency 314. For example, the intensity of EMI caused by a 5.1 Dolby audio system is about 6 times higher than that caused by a mono-channel audio system.

As such, reducing RF interference of multi-channel audio playback apparatuses is desired.

BRIEF SUMMARY OF INVENTION

A detailed description is given in the following embodiments with reference to the accompanying drawings.

In a first aspect of the present invention, a multi-channel audio playback apparatus comprising a channel interface, a first switching amplifier and a second switching amplifier is provided. The channel interface is used to receive multi-channel digital data and generate first channel digital data and second channel digital data. The first switching amplifier is used to convert the first channel digital data into a first pulse width modulation (PWM) signal according to a first reference signal with a first frequency, and the second switching amplifier is used to convert the second channel digital data into a second PWM signal according to a second reference signal with a second frequency, wherein the second frequency is different from the first frequency.

In a first aspect of the present invention, a multi-channel audio playback method comprises the step of receiving multi-channel digital data and generating first channel digital data and second channel digital data. Next, a first reference signal with a first frequency and a second reference signal with a second frequency are generated, wherein the second frequency is different from the first frequency. Following, the first channel digital data is converted into a first pulse width modulation (PWM) signal according to the first reference signal with the first frequency, and the second channel digital data is converted into a second PWM signal according to the second reference signal with the second frequency.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
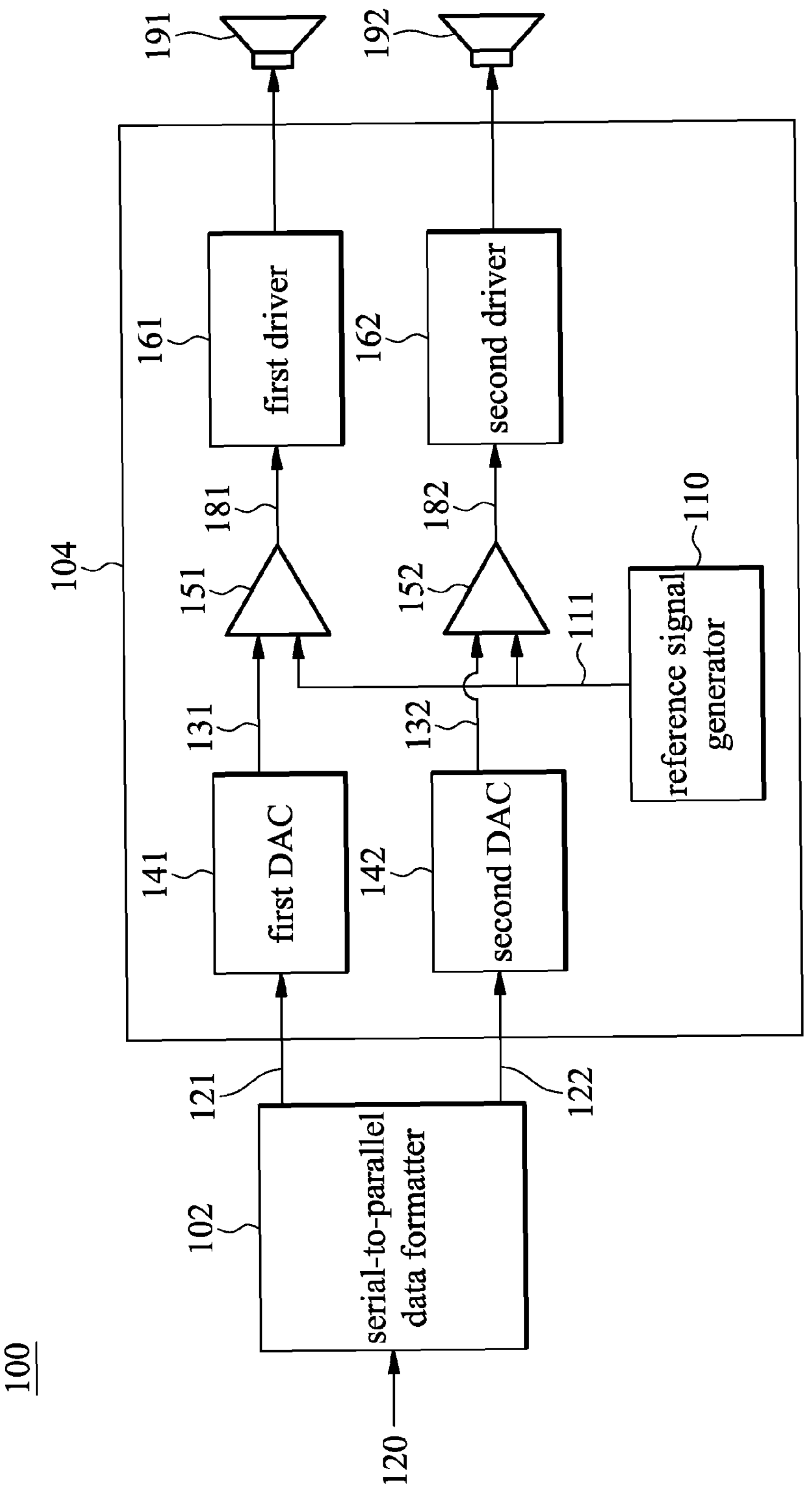
FIG. 1 ( PRIOR ART )
FIG. 1 shows a schematic diagram of a conventional multi-channel audio playback apparatus.
Figure 2A:
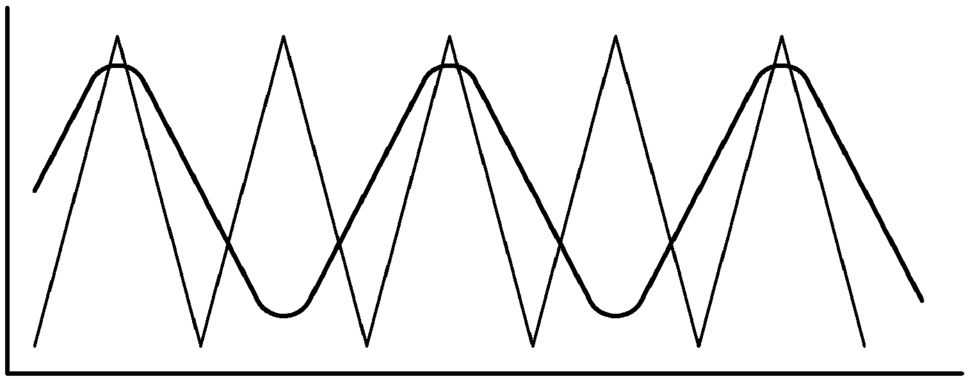
FIG. 2A ( PRIOR ART )
FIG. 2A illustrates the relationship between the first channel analog data 131 and the reference signal of FIG. 1.
Figure 2B:
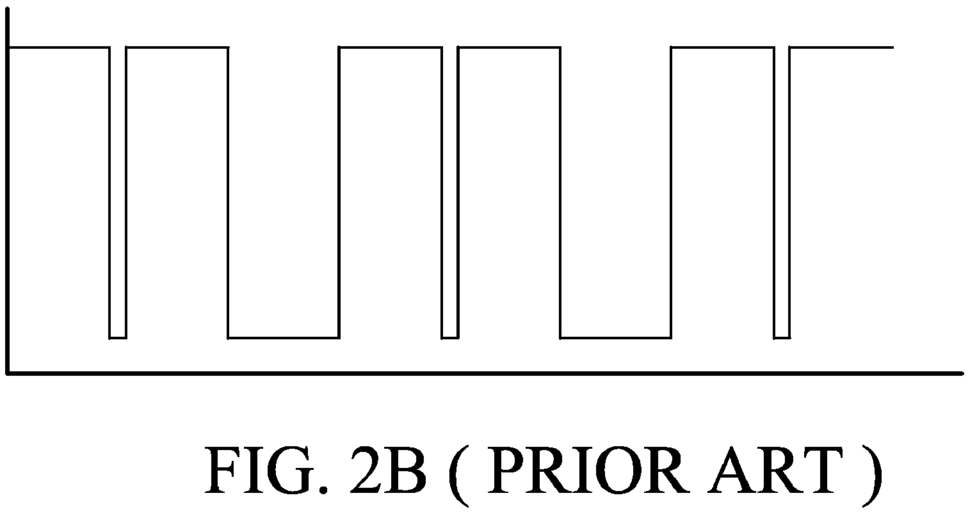
FIG. 2B ( PRIOR ART )
FIG. 2B illustrates the first PWM signal of FIG. 1.
Figure 2C:
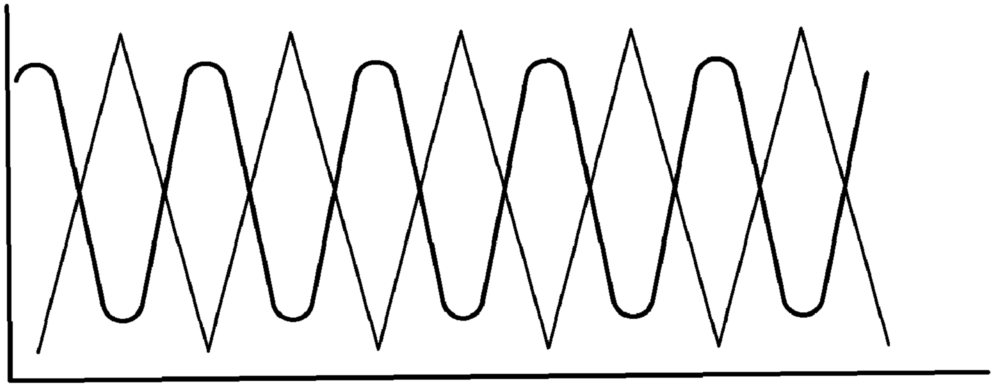
FIG. 2C ( PRIOR ART )
FIG. 2C illustrates the relationship between the second channel analog data 132 and the reference signal of FIG. 1.
Figure 2D:
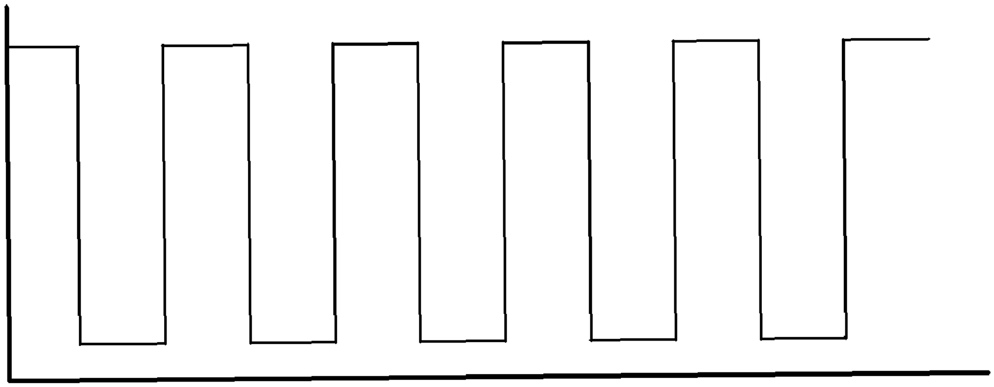
FIG. 2D ( PRIOR ART )
FIG. 2D illustrates the second PWM signal of FIG. 1.
Figure 3A:
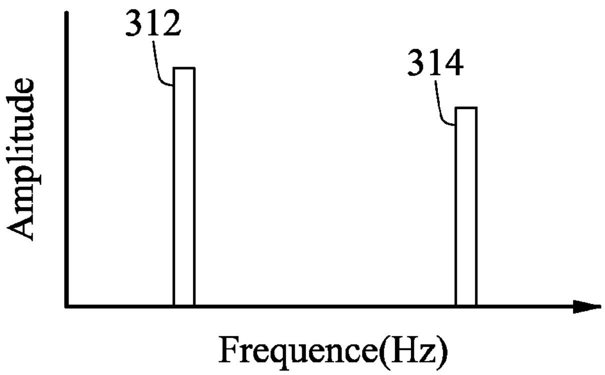
FIG. 3A ( PRIOR ART )
FIGS. 3A, 3B and 3C respectively shows the frequency spectrum of the first PWM signal, the second PWM signal and combinations thereof of FIG. 1.
Figure 3B:
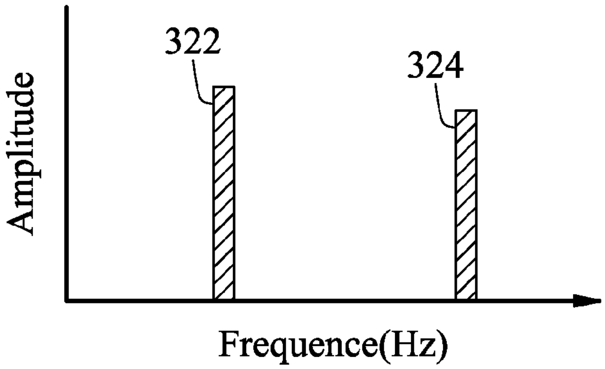
FIG. 3B ( PRIOR ART )
Figure 3C:
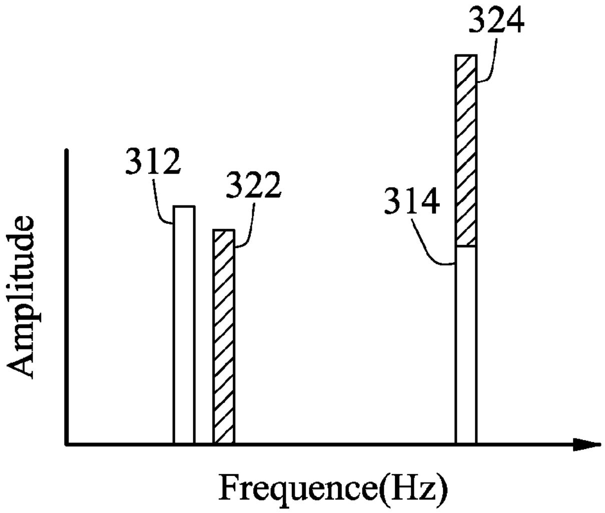
FIG. 3C ( PRIOR ART )
Figure 4:
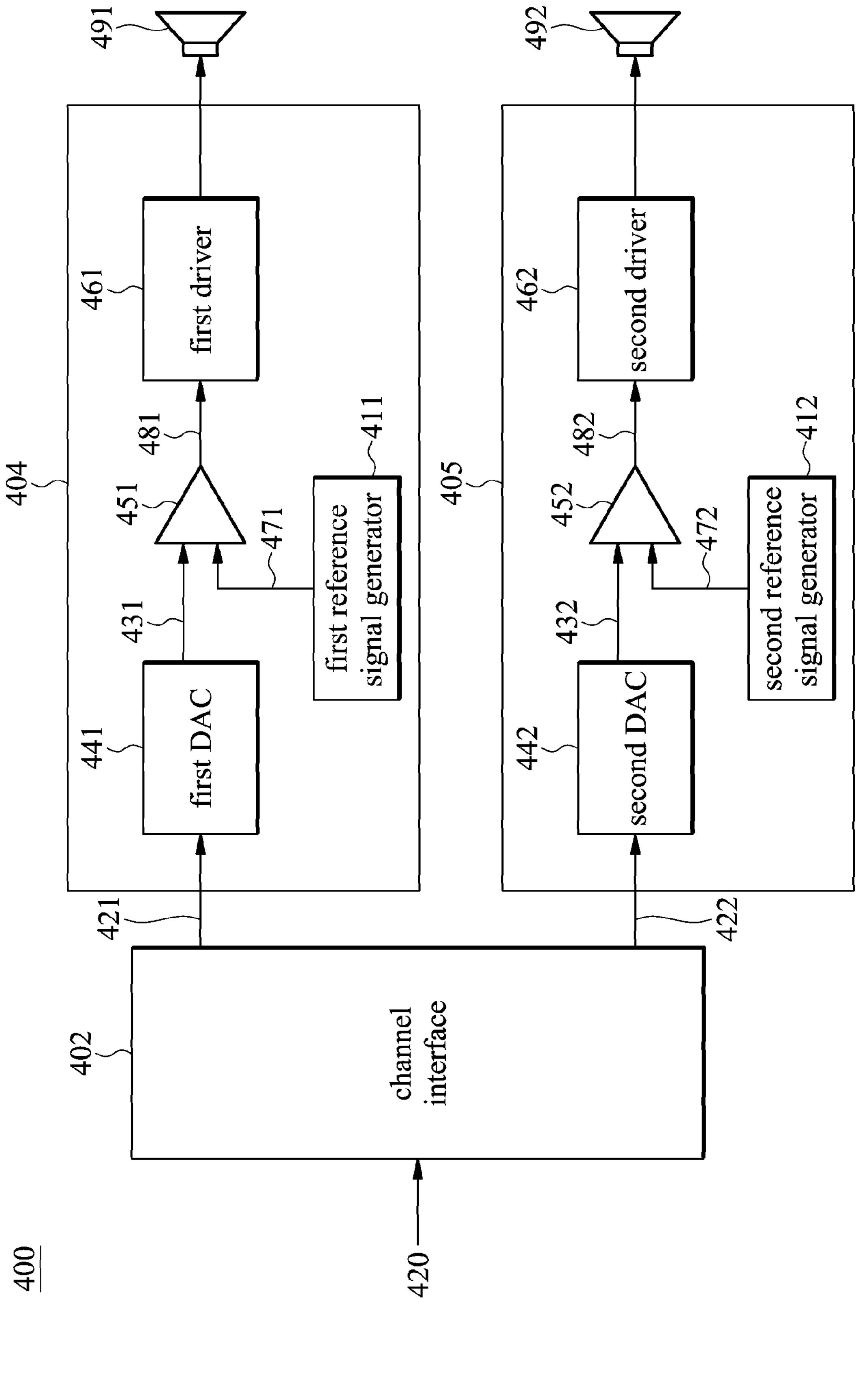
FIG. 4 shows a schematic diagram of a multi-channel audio playback apparatus according to the present invention.

FIG. 4 shows a schematic diagram of a multi-channel audio playback apparatus according to the present invention. For convenience, the multi-channel audio playback apparatus 400 is described as a two-channel audio playback apparatus (stereo audio system) hereinafter, however, those skilled in the art will appreciate that the invention is not limited in this regard. The multi-channel audio playback apparatus 400 comprises a channel interface 402, a first switching amplifier 404, a second switching amplifier 405, a first loudspeaker 491 and a second loudspeaker 492.

The channel interface 402 can be a serial-to-parallel data formatter, which receives multi-channel digital data 420 from a source (not shown) and separates the multi-channel digital data 420 in serial format into first channel digital data 421 and second digital data 422 in parallel format. The first switching amplifier 404 further comprises a first digital-to-analog converter (DAC) 441, a first reference signal generator 411, a first comparator 451 and a first driver 461. The second switching amplifier 405 further comprises a second DAC 442, a second reference signal generator 412, a second comparator 452, and a second driver 462. In this embodiment, the DACs, comparators, reference signal generators and drivers herein are disposed in pairs to be applied on two channels. In other embodiments, the number of DACs, comparators, and reference signal generators increase along with the number of channels that a multi-channel audio playback apparatus has. The first DAC 441 and the second DAC 442 respectively convert the first channel digital data 431 and the second channel digital data 432 into first channel analog data 441 and second channel analog data 442. The first reference signal generator 411 generates a first reference signal 471 with a first frequency and outputs the first reference signal 471 to the first comparator 451, and the second reference signal generator 412 generates a second reference signal 472 with a second frequency and outputs the second reference signal 472 to the second comparator 452. The first reference signal 471 and the second reference signal 472 are provided to the first comparator 451 and the second comparator 452 respectively and independently. Specifically, the first frequency of the first reference signal 471 is different from the second reference signal 472, which will be described as follows.

Figure 5A:
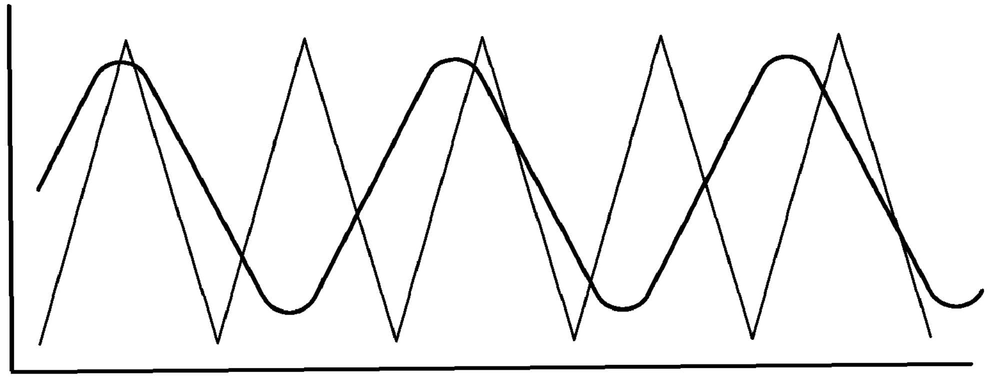
FIG. 5A illustrates the relationship between the first channel analog data 431 and the first reference signal of FIG. 4.
Figure 5B:
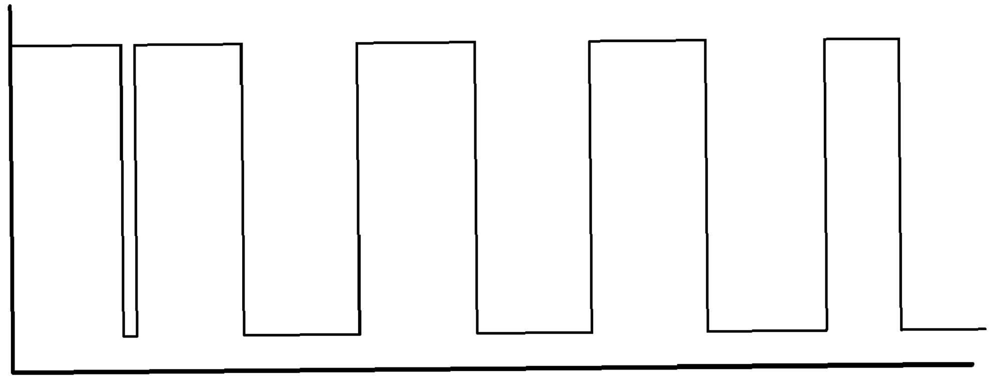
FIG. 5B illustrates the first PWM signal of FIG. 4.
Figure 5C:
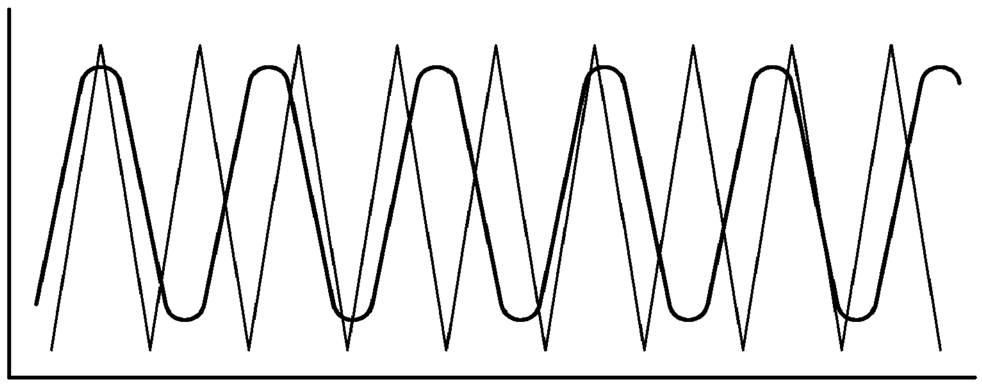
FIG. 5C illustrates the relationship between the second channel analog data 432 and the second reference signal of FIG. 4.
Figure 5D:
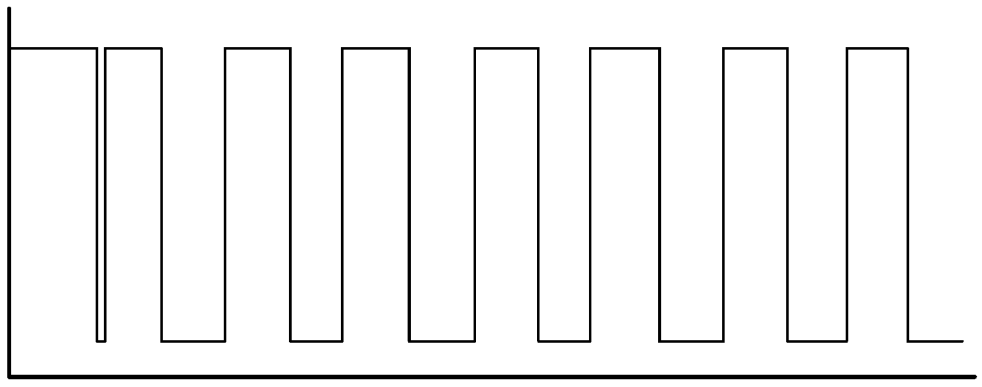
FIG. 5D illustrates the second PWM signal of FIG. 4.

FIG. 5A illustrates the relationship between the first channel analog data 431 and the first reference signal 471 of FIG. 4. In this embodiment, the first channel analog data 431 is a sine wave with a frequency, for example, of 7 kHz, while the first reference signal 471 is a saw-toothed wave with a first frequency, for example, of 100 kHz. The first comparator 451 receives the first channel analog data 431 from the first DAC 441 and the first reference signal 471 from the first reference signal generator 410 and compares the first channel analog data 431 with first reference signal 471 in order to generate a first pulse width modulation (PWM) signal 481. FIG. 5B illustrates the first PWM signal 481 of FIG. 4. Like the prior art described above, when the first channel analog signal 431 is higher than the first reference signal 471, the first PWM signal 481 is high (labeled as “1” in FIG. 5B). When the first channel analog signal 431 is lower than the first reference signal 471, the first PWM signal 481 is low (labeled as “0” in FIG. 5B). FIG. 5C illustrates the relationship between the second channel analog data 432 and the second reference signal 472 of FIG. 4 and FIG. 5D illustrates the second PWM signal 482 of FIG. 4. In this embodiment, for example, the second channel analog data 432 is a sine wave with a frequency, for example, 13.3 kHz, while the second reference signal 471 is a saw-toothed wave with a second frequency, for example, 131 kHz. Accordingly, the second comparator 452 compares the second channel analog data 432 with the second reference signal 470 in order to generate the second PWM signal 482. Then, the first driver 461 and the second driver 462 respectively use the first PWM signal 481 and the second PWM signal 482 to drive the first loudspeaker 491 and the second loudspeaker 492. Then, the first driver 461 and the second driver 462 respectively use the first PWM signal 481 and the second PWM signal 482 to drive the first loudspeaker 491 and the second loudspeaker 492.

Figure 6A:
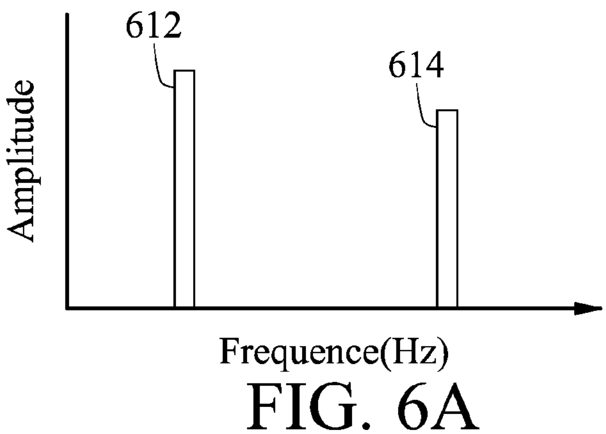
FIGS. 6A, 6B and 6C respectively shows the frequency spectrum of the first PWM signal, the second PWM signal and combinations thereof of FIG. 4.
Figure 6B:
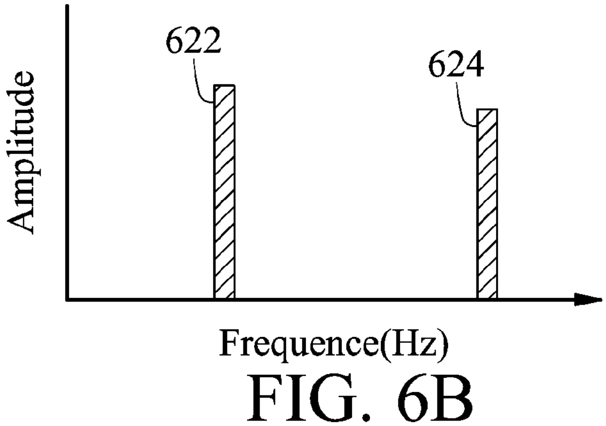
Figure 6C:
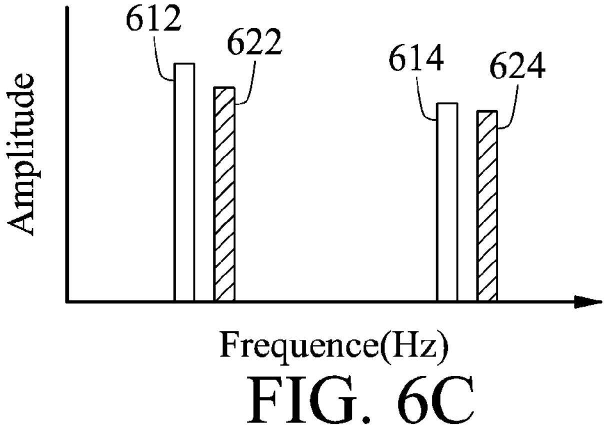

To summarize, the first switching amplifier 404 converts the first channel digital data 421 into the first PWM signal 481 according the first reference signal 471 with a first frequency, while the second switching amplifier 405 converts the second channel digital data 422 into the second PWM signal 482 according the second reference signal 472, wherein the second frequency is different from the first frequency. FIG. 6A and 6B respectively show the frequency spectrum of the first PWM signal 481 and the second PWM signal 482. The first PWM signal 481 in the frequency spectrum comprises a first channel audio frequency 612 corresponding to the first channel analog data 431 and a first carrier frequency 614 corresponding to the first reference signal 471. Accordingly, the second PWM signal 482 comprises a second channel audio frequency 622 corresponding to the second channel analog data 432 and a second carrier frequency 624 corresponding to the second reference signal 472. In this embodiment, because the first frequency of the first PWM signal 481, 100 kHz, is different from the second frequency of the second PWM signal 482, which is 133 kHz, the first carrier frequency, which is 100 kHz, is different from the second carrier frequency, which is 133 kHz. Specifically, since the two carrier frequencies 614 and 624 are different, the amplitude thereof will not be superimposed together like that in the prior art. Therefore, the RF interference caused by the multi-channel audio playback apparatus 400 according to the present invention is significantly reduced. Moreover, in another embodiment, the first frequency of the first reference signal 471 provided by the first reference signal generator 411 and the second frequency of the second reference signal 472 provided by the second reference signal generator 412 are not only different but also relatively prime frequencies. In this case, the harmonics of the first frequency and the second frequency will exceed the frequency band which causes the RF interference.

Figure 7A:
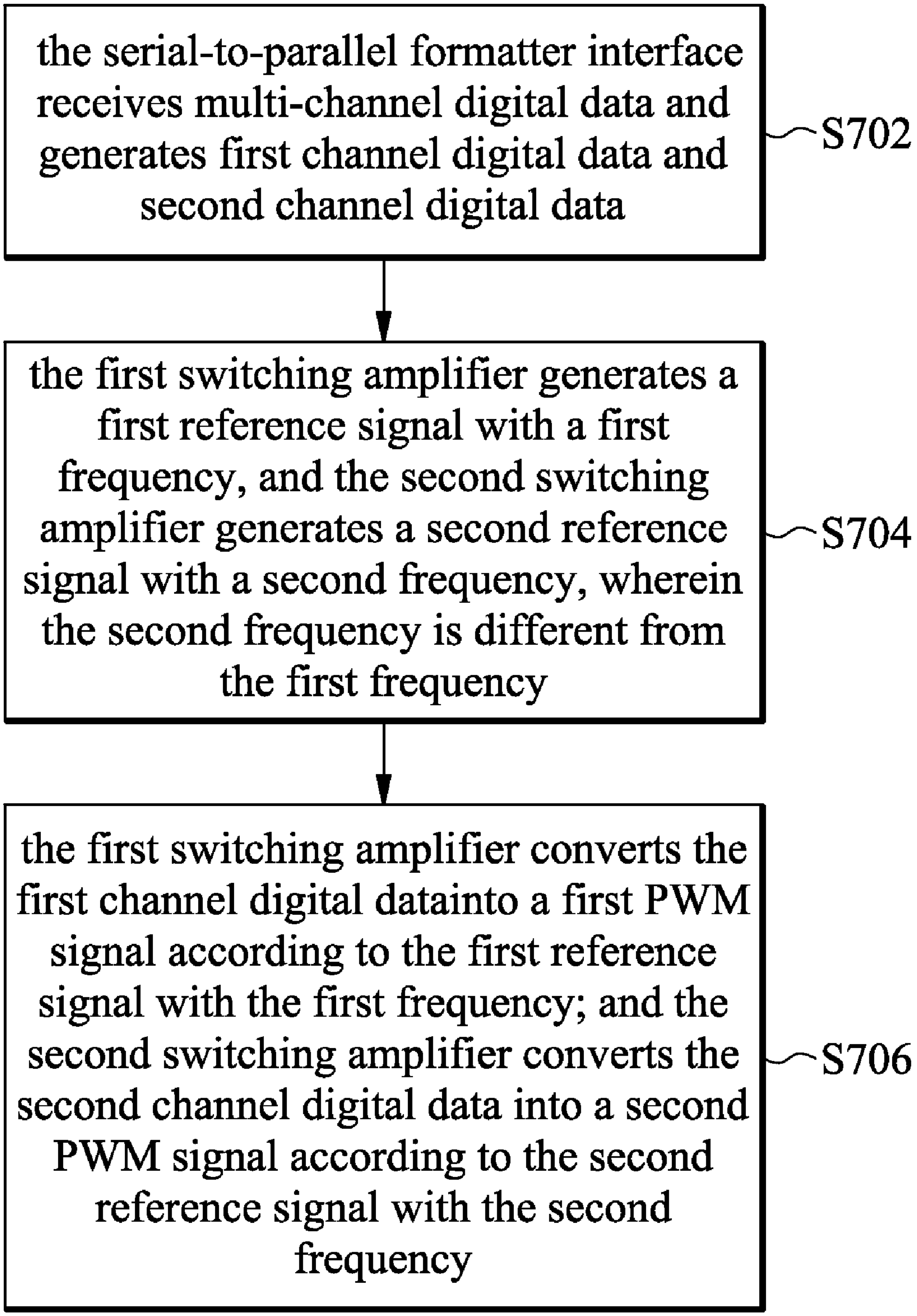
FIG. 7A is a flow chart of the multi-channel audio playback method according to the present invention.

The following describes a multi-channel audio playback method for reducing the RF interference. FIG. 7A is a flow chart of the multi-channel audio playback method according to the present invention. Please refer to FIGS. 7A and 7B and FIG. 4 together. In step S702, the serial-to-parallel formatter interface 402 receives multi-channel digital data 420 and generates first channel digital data 421 and second channel digital data 422. In step S704, the first switching amplifier 404 generates a first reference signal 471 with a first frequency, and the second switching amplifier 405 generates a second reference signal 472 with a second frequency, wherein the second frequency is different from the first frequency. In step S706, the first switching amplifier 404 converts the first channel digital data 421 into a first PWM signal 481 according to the first reference signal 471 with the first frequency, and the second switching amplifier 405 converts the second channel digital data 422 into a second PWM signal 482 according to the second reference signal 472 with the second frequency.

Figure 7B:
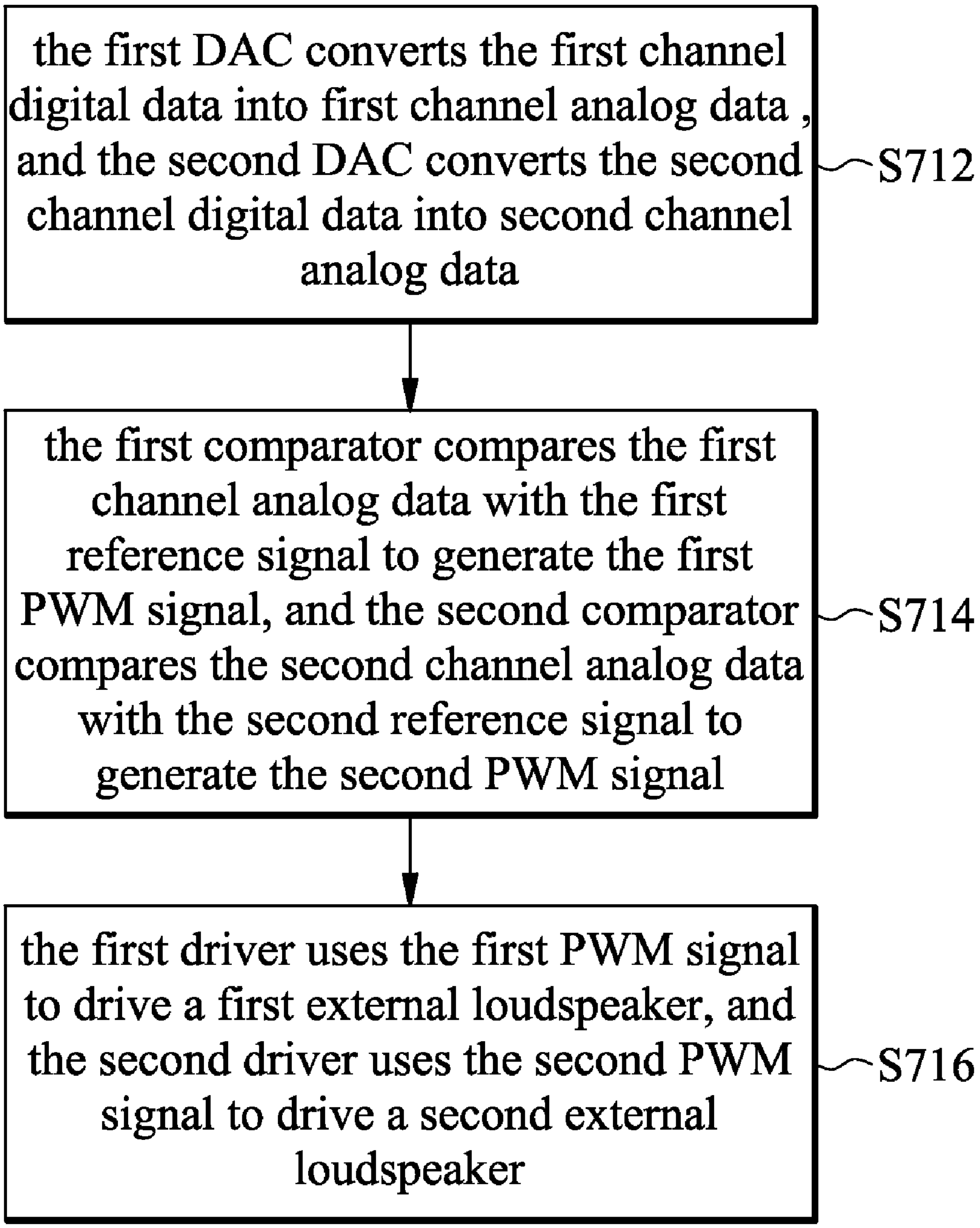
FIG. 7B is a detailed flow chart of the step S704 of FIG. 7A.

FIG. 7B is a detailed flow chart of the step S704 of FIG. 7A. The method further comprises the steps S712, S714 and S716. In step S712, the first DAC 441 converts the first channel digital data 421 into first channel analog data 441, and the second DAC 442 converts the second channel digital data 422 into second channel analog data 432. In step S714, the first comparator 451 compares the first channel analog data 431 with the first reference signal 471 to generate the first PWM signal 481, and the second comparator 452 compares the second channel analog data 432 with the second reference signal 472 to generate the second PWM signal 482. In step S716, the first driver 461 uses the first PWM signal 481 to drive a first external loudspeaker 491, and the second driver 462 uses the second PWM signal 482 to drive a second external loudspeaker 492.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multi-channel audio playback apparatus, comprising:
- a channel interface for receiving multi-channel digital data and generating first channel digital data and second channel digital data;
- a first switching amplifier for converting the first channel digital data into a first pulse width modulation (PWM) signal according to a first reference signal with a first frequency; and
- a second switching amplifier for converting the second channel digital data into a second PWM signal according to a second reference signal with a second frequency,
- wherein the second frequency is different from the first frequency.

2. The multi-channel audio playback apparatus as claimed in claim 1, wherein the first switching amplifier further comprises:
- a first digital-to-analog converter for converting the first channel digital data into first channel analog data;
- a first reference signal generator for generating the first reference signal with the first frequency; and
- a first comparator for comparing the first channel analog data with the first reference signal and generating the first PWM signal; and the second switching amplifier further comprises:
- a second digital-to-analog converter for converting the second channel digital data into second channel analog data;
- a second reference signal generator for generating the second reference signal with the second frequency; and
- a second comparator for comparing the second channel analog data with the second reference signal and generating the second PWM signal.

3. The multi-channel audio playback apparatus as claimed in claim 2, wherein the first switching amplifier further comprises a first driver using the first PWM signal to drive a first external loudspeaker, and the second switching amplifier further comprises a second driver using the second PWM signal to drive a second external loudspeaker.

4. The multi-channel audio playback apparatus as claimed in claim 1, wherein the channel interface comprises a serial-to-parallel data formatter for converting the multi-channel digital data in serial format into the first channel digital data and the second channel digital data in parallel format.

5. The multi-channel audio playback apparatus as claimed in claim 1, wherein the first reference signal and the second reference signal are in saw-toothed waveform.

6. The multi-channel audio playback apparatus as claimed in claim 1, wherein the first frequency and the second frequency are relatively prime frequencies.

7. A multi-channel audio playback method, comprising the steps of:
- receiving multi-channel digital data and generating first channel digital data and second channel digital data;
- generating a first reference signal with a first frequency and a second reference signal with a second frequency, wherein the second frequency is different from the first frequency;
- converting the first channel digital data into a first pulse width modulation (PWM) signal according to the first reference signal with the first frequency; and
- converting the second channel digital data into a second PWM signal according to the second reference signal with the second frequency.

8. The multi-channel audio playback method as claim in claim 7, wherein the method further comprises:
- converting the first channel digital data into first channel analog data;
- converting the second channel digital data into second channel analog data;
- comparing the first channel analog data with the first reference signal to generate the first PWM signal; and
- comparing the second channel analog data with the second reference signal to generate the second PWM signal.

9. The multi-channel audio playback method as claim in claim 8, wherein the method further comprises the step of using the first PWM signal to drive a first external loudspeaker, and using the second PWM signal to drive a second external loudspeaker.

10. The multi-channel audio playback method as claim in claim 7, wherein the method further comprises the step of converting the multi-channel digital data in serial format into the first channel digital data and the second channel digital data in parallel format.

11. The multi-channel audio playback method as claim in claim 7, wherein the first reference signal and the second reference signal are in saw-toothed waveform.

12. The multi-channel audio playback method as claim in claim 7, wherein the first frequency and the second frequency are relatively prime frequencies.

* * * * *